United States Patent
Hetsugi

(10) Patent No.: US 11,709,182 B2
(45) Date of Patent: Jul. 25, 2023

(54) ELECTRICAL CONNECTING DEVICE AND INSPECTION METHOD

(71) Applicant: Kabushiki Kaisha Nihon Micronics, Tokyo (JP)

(72) Inventor: Shota Hetsugi, Oita (JP)

(73) Assignee: Kabushiki Kaisha Nihon Micronics, Musashino (JP)

( * ) Notice: Subject to any disclaimer, the term of this patent is extended or adjusted under 35 U.S.C. 154(b) by 0 days.

(21) Appl. No.: 17/216,078

(22) Filed: Mar. 29, 2021

(65) Prior Publication Data
US 2021/0318354 A1    Oct. 14, 2021

(30) Foreign Application Priority Data

Apr. 8, 2020 (JP) .............................. JP2020-070037

(51) Int. Cl.
*G01R 1/067* (2006.01)
*G01R 1/073* (2006.01)

(52) U.S. Cl.
CPC ......... *G01R 1/06794* (2013.01); *G01R 1/073* (2013.01)

(58) Field of Classification Search
None
See application file for complete search history.

(56) References Cited

U.S. PATENT DOCUMENTS

| | | | | |
|---|---|---|---|---|
| 2006/0114008 A1* | 6/2006 | Fujii | .................. | G01R 31/2886 324/756.07 |
| 2007/0159194 A1* | 7/2007 | Hasegawa | .......... | G01R 31/2889 324/750.19 |
| 2009/0284277 A1* | 11/2009 | Yamada | ............. | G01R 31/2891 324/754.08 |
| 2010/0277193 A1* | 11/2010 | Yonezawa | .......... | G01R 1/06727 324/755.07 |
| 2013/0169305 A1 | 7/2013 | Taguchi et al. | | |

FOREIGN PATENT DOCUMENTS

| | | |
|---|---|---|
| JP | 2010204122 A | 9/2010 |
| JP | 2013138157 A | 7/2013 |

OTHER PUBLICATIONS

European Patent Office, European Search Report, dated Aug. 17, 2021, For European Patent Application No. EP21165838.

* cited by examiner

*Primary Examiner* — Nasima Monsur
(74) *Attorney, Agent, or Firm* — Lorenz & Kopf, LLP

(57) ABSTRACT

An electrical connecting device includes a probe head, and probes for measurement and probes for confirmation held by the probe head. The probe head holds the probes for measurement and the probes for confirmation in a state in which the respective tip ends are exposed therefrom. An exposed length from the probe head to the tip end is shorter for the probes for confirmation than for the probes for measurement.

9 Claims, 5 Drawing Sheets and INSPECTION METHOD

CROSS-REFERENCE TO RELATED APPLICATIONS

This application is based upon and claims the benefit of priority from prior Japanese Patent Application P2020-070037, filed on Apr. 8, 2020; the entire contents of which are incorporated by reference herein.

BACKGROUND

Technical Field

Embodiments described herein relate generally to an electrical connecting device and an inspection method used for measuring electrical characteristics of an inspection object.

Description of the Related Art

An electrical connecting device including probes to be brought into contact with an inspection object is used to measure the electrical characteristics of the inspection object such as a semiconductor integrated circuit in a state of not being separated from a wafer. The electrical connecting device has a structure in which a probe head that holds the probes is attached to a wiring substrate, for example. The base ends of the probes are connected to the wiring substrate, while the respective tip ends of the probes are brought into contact with the inspection object during the measurement of the inspection object.

The probes and the inspection object are electrically connected to each other during the measurement of the inspection object. The overdrive (OD) acts on the probes so as to strongly press the probes against the inspection object. A constant overdrive amount is set for the electrical connecting device so as to bring the probes into contact with the inspection object with a predetermined pressure derived from the OD. The amount of the OD to be set is herein referred to as a "program overdrive (POD)".

The confirmation of the amount of overdrive actually acting on the probes (herein referred to as an "actual overdrive (AOD)") based on the set POD is effective to ensure the electrical connection between the probes and the inspection object. The failure in the accurate confirmation of the relationship between the POD and the AOD may impede the contact between the probes and the inspection object with a predetermined pressure.

BRIEF SUMMARY

An aspect of the present disclosure provides an electrical connecting device including a probe head, and a probe for measurement and a probe for confirmation held by the probe head. A tip-end length that is an exposed length from the probe head to a tip end is shorter for the probe for confirmation than for the probe for measurement.

Another aspect of the present disclosure provides an inspection method that decreases a gap between a probe head and a substrate for inspection to bring a probe for confirmation having a shorter tip-end length than a probe for measurement into contact with the substrate for inspection, and stores an overdrive amount acting on the probe for measurement.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
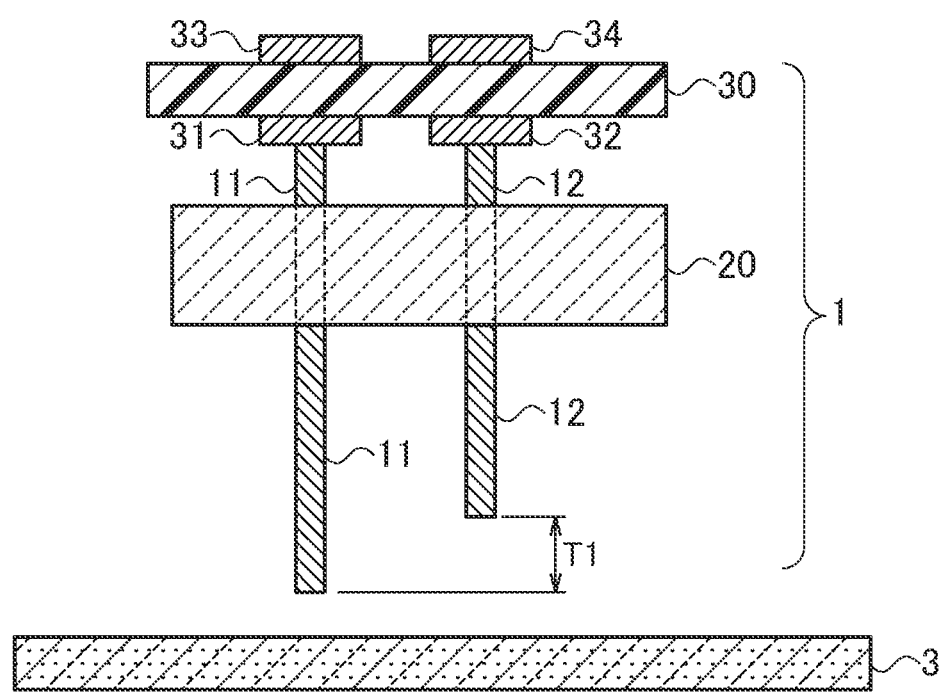
FIG. 1 is a schematic diagram showing a configuration of an electrical connecting device according to an embodiment of the present invention.

Embodiments according to the present invention will be described below with reference to the drawings. The same or similar elements in the following explanations with reference to the drawings are denoted by the same or similar reference numerals. It should be understood that the drawings are illustrated schematically, and the proportions of the thicknesses of the respective elements are not necessarily drawn to scale. It should also be understood that the relationships or proportions of the dimensions between the respective drawings can differ from each other. The embodiments described below illustrate a device and a method for embodying the technical ideas of the present disclosure, but the respective embodiments are not intended to be limited to the materials, shapes, structures, or arrangements of the constituent elements as described herein.

An electrical connecting device 1 according to an embodiment of the present invention as illustrated in FIG. 1 is used for measurement of electrical characteristics of an inspection object (not illustrated) provided on a semiconductor substrate 3. The electrical connecting device 1 includes a probe head 20 arranged to face the semiconductor substrate 3, and probes for measurement 11 and probes for confirmation 12 held by the probe head 20.

The probe head 20 holds the probes for measurement 11 used for the measurement of the inspection object in a state in which the respective tip ends are exposed from the probe head 20. The respective tip ends of the probes for measurement 11 are brought into contact with pads for measurement of the inspection object upon the measurement of the inspection object.

The probe head 20 also holds the probes for confirmation 12 in a state in which the respective tip ends are exposed from the probe head 20. The exposed length from the probe head 20 to the respective tip ends (referred to below as a "tip-end length") is shorter for the probes for confirmation 12 than for the probes for measurement 11. FIG. 1 indicates a difference in the tip-end length between the probes for measurement 11 and the probes for confirmation 12 by reference numeral T1.

The probes for measurement 11 are brought into contact with the pads for measurement with a predetermined pressure when overdrive (OD) acts on the probes for measurement 11 upon the measurement of the inspection object. For example, the probes for measurement 11 are buckled when brought into contact with the inspection object and are elastically deformed so that the OD acts thereon. Alternatively, the probes for measurement 11 each may include a spring part that is extendable in the axial direction. Examples of probes having a spring part include a probe provided with a spiral thread on the circumferential surface to serve as the spring part, and a probe with built-in spring such as a pogo pin.

The probes for measurement 11 penetrate the probe head 20. The electrical connecting device 1 includes a wiring substrate 30 including lands for measurement 31 to which the base ends of the probes for measurement 11 projecting from the probe head 20 are connected. The lands for measurement 31 are electrically connected to connection terminals for measurement 33 arranged on the wiring substrate 30 in a wiring pattern (not illustrated) provided on the wiring substrate 30. For example, the lands for measurement 31 are arranged on one of the main surfaces of the wiring substrate 30, and the connection terminals for measurement 33 are arranged on the other main surface. The connection terminals for measurement 33 are electrically connected to an inspecting device such as a tester (not illustrated). An electrical signal is transferred between the inspecting device and the inspection object via the electrical connection device 1. For example, an electrical signal is sent to the inspection object from the inspecting device via the wiring substrate 30 and the probes for measurement 11, and the electrical signal output from the inspection object is sent to the inspecting device.

The probes for confirmation 12 penetrate the probe head 20, as in the case of the probes for measurement 11. The base ends of the probes for confirmation 12 projecting from the probe head 20 are brought into contact with lands for confirmation 32 arranged on the wiring substrate 30. The lands for confirmation 32 are electrically connected to confirmation terminals for connection 34 arranged on the wiring substrate 30 in a wiring pattern (not illustrated) provided on the wiring substrate 30.

A region in which the probe head 20 holds the probes for measurement 11 corresponds to a region opposed to the inspection object in the probe head 20. The region of the probe head 20 holding the probes for measurement 11 is referred to below as a "probe area for measurement".

Figure 2:
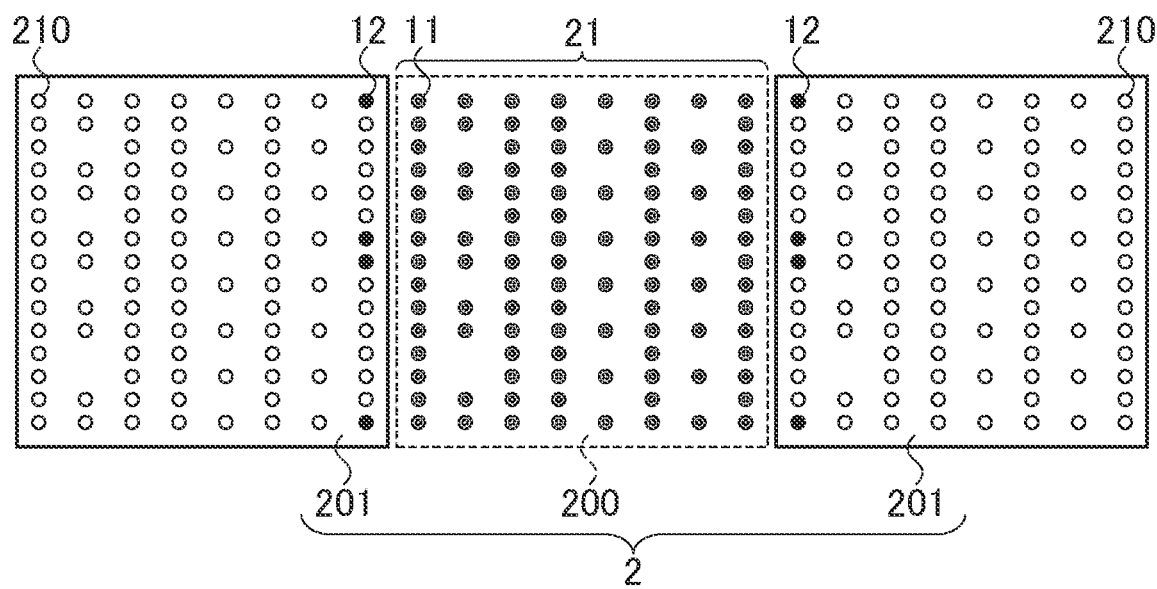
FIG. 2 is a schematic plan view showing a relation of arrangement between probes for measurement and probes for confirmation.

FIG. 2 is a diagram showing an example of arrangement positions of the probes for measurement 11 and the probes for confirmation 12. FIG. 2 illustrates the probe head 20 in a plan view in a state of overlapping with a substrate for inspection 2 used upon the confirmation of the AOD. FIG. 2 shows the main surface of the substrate for inspection 2 and illustrates the probe head 20 in a transparent state while omitting the illustration of the probes for measurement 11 and the probes for confirmation 12. FIG. 2 indicates the positions of the probes for confirmation 12 by the black dots, and the positions of the probes for measurement 11 by the double circles (the same is applied to the following explanations).

The substrate for inspection 2 includes an inspection chip region 200, and adjacent chip regions 201 arranged on both sides of the inspection chip region 200. FIG. 2 illustrates the inspection chip region 200 in a plan view in a state of overlapping with the probe area for measurement 21 of the probe head 20. The inspection chip region 200 and the adjacent chip regions 201 are provided with pads for inspection 210 arranged on the respective main surfaces thereof. The arrangement of the pads for inspection 210 on the main surfaces of the inspection chip region 200 and the respective adjacent chip regions 201 is the same as the arrangement of the pads for measurement on the inspection object. FIG. 2 indicates the pads for inspection 210 by the white dots.

The respective positions of the probes for measurement 11 and the probes for confirmation 12 of the probe head 20 are opposed to the positions of the pads for inspection 210 of the substrate for inspection 2. The positions of the probes for measurement 11 thus conform to the positions of the pads for inspection 210 of the inspection chip region 200 in the probe area for measurement 21 in a plan view.

FIG. 2 illustrates the case in which the probes for confirmation 12 are arranged to be opposed to the pads for inspection 210 in the respective adjacent chip regions 201. The probe head 20 in this case holds the probes for confirmation 12 on the outside of the probe area for measurement 21 in a plan view.

The probes for confirmation 12 are preferably arranged in the regions close to the probe area for measurement 21, as illustrated in FIG. 2. This arrangement enables the confirmation of the relationship between the POD and the AOD acquired by the inspection by use of the probes for confirmation 12 described in detail below at the positions proximate to the probes for measurement 11 to be brought into contact with the inspection object during the measurement.

Figure 3:
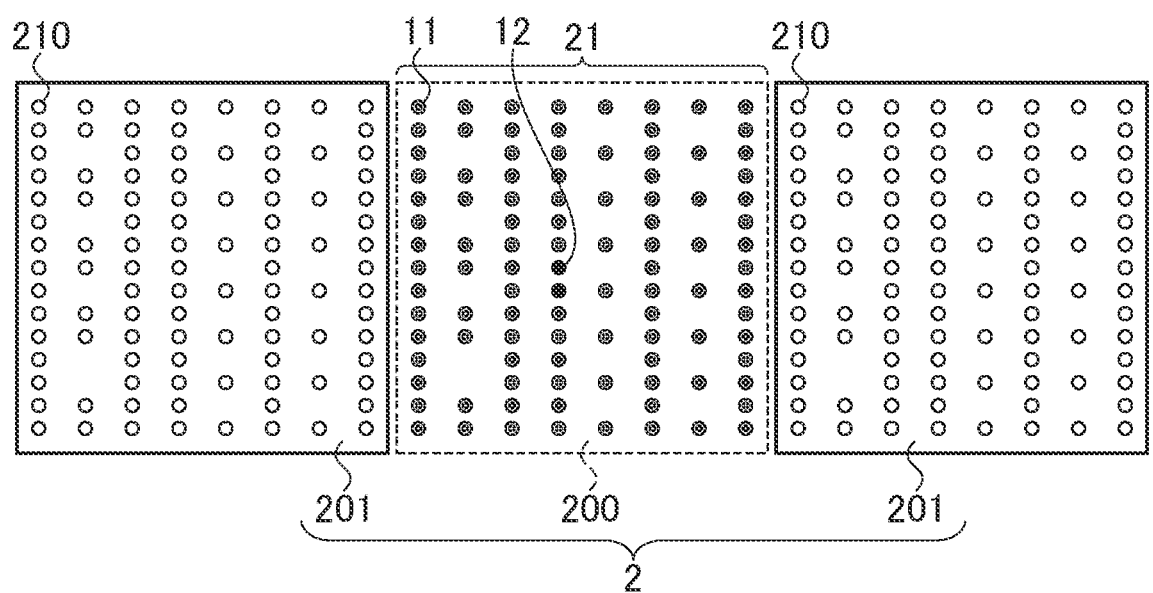
FIG. 3 is a schematic plan view showing another relation of arrangement between the probes for measurement and the probes for confirmation.

Alternatively, as illustrated in FIG. 3, the probes for confirmation 12 may be arranged in the probe area for measurement 21, instead of the outside of the probe area for measurement 21. In other words, the probes for measurement 11 and the probes for confirmation 12 may be present and mixed together in the probe area for measurement 21. This arrangement enables the confirmation of the relationship between the POD and the AOD upon the measurement of the inspection object with a higher accuracy.

The difference T1 in the tip-end length between the probes for measurement 11 and the probes for confirmation 12 is set depending on the contact pressure applied by the probes for measurement 11 against the inspection object. The AOD, which varies depending on the difference T1 in the tip-end length between the probes for measurement 11 and the probes for confirmation 12, acts on the probes for measurement 11 when the tip ends of the probes for confirmation 12 are brought into contact with the pads for inspection. As described below, the electrical connecting device 1 can confirm the AOD when bringing the probes for measurement 11 into contact with the inspection object with a predetermined pressure derived from the set POD. An inspection method by use of the electrical connecting device 1 for confirming the relationship between the POD and the AOD is described below with reference to the flowchart shown in FIG. 4.

Figure 4:
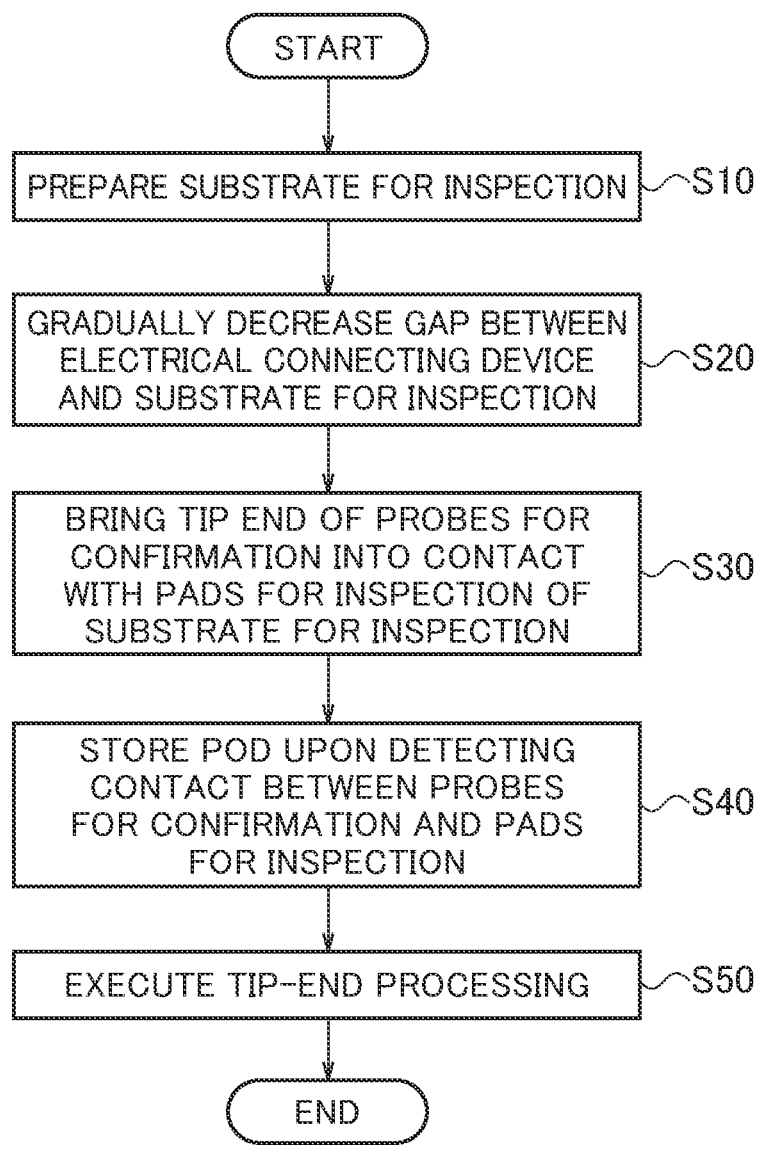
FIG. 4 is a flowchart for explaining an inspection method according to the embodiment of the present invention.

First, in step S10 shown in FIG. 4, the substrate for inspection 2 provided with the pads for inspection 210 is prepared.

Figure 5:
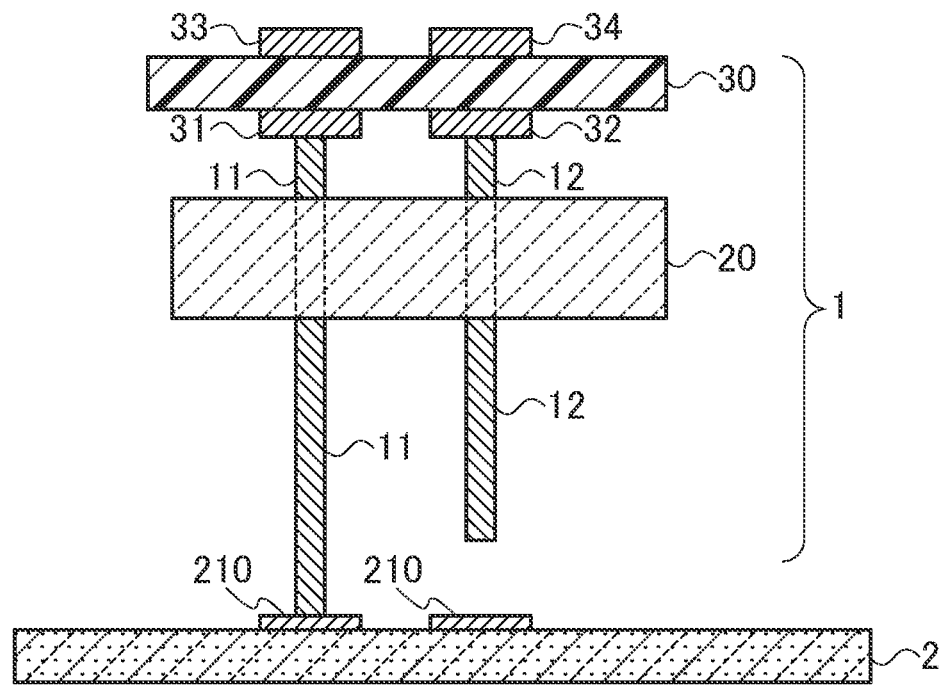
FIG. 5 is a schematic diagram for explaining the inspection method according to the embodiment of the present invention (Part 1).

In step S20, a gap between the electrical connecting device 1 and the substrate for inspection 2 is gradually decreased. As illustrated in FIG. 5, the respective tip ends of the probes for measurement 11 are first brought into contact with the pads for inspection 210 of the substrate for inspection 2.

Figure 6:
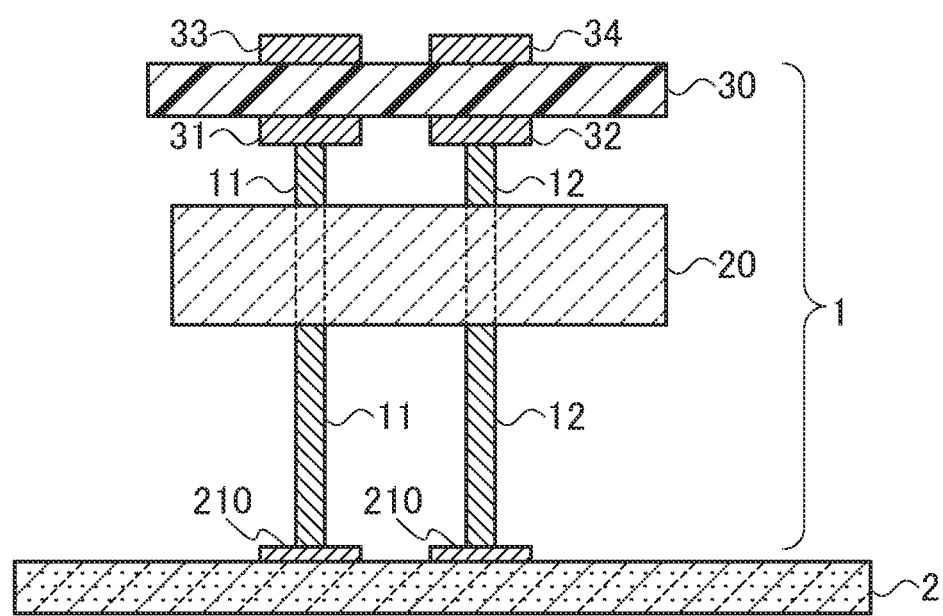
FIG. 6 is a schematic diagram for explaining the inspection method according to the embodiment of the present invention (Part 2).

In step S30, a gap between the probe head 20 and the substrate for inspection 2 is further gradually decreased so as to bring the respective tip ends of the probes for confirmation 12 into contact with the pads for inspection 210, as illustrated in FIG. 6. Since the base ends of the probes for confirmation 12 are in contact with the lands for confirmation 32, a stress is applied to the probes for confirmation 12. The POD of the OD acting on the probes for measurement 11 is then gradually increased. The difference in the tip-end length between the probes for measurement 11 and the probes for confirmation 12 has been set to the value depending on the desirable AOD to be confirmed. In the state in which the tip ends of the probes for confirmation 12 are in contact with the pads for inspection 210, the OD acts on the probes for measurement 11 with the AOD so that the probes for measurement 11 are brought into contact with the inspection object with a predetermined pressure. The respective spring parts of the probes for measurement 11 extend in the axial direction and are elastically deformed so as to be brought into contact with the inspection object.

In step S40, the POD is stored in the state in which the contact between the probes for confirmation 12 and the pads for inspection 210 is detected. The POD stored is referred to also as a "set overdrive amount".

In step S50, a processing step of shortening the tip-end length of the probes for confirmation 12 (referred to below as "tip-end processing") is executed so as not to bring the tip ends of the probes for confirmation 12 into contact with the semiconductor substrate 3 during the measurement of the inspection object. The tip-end processing cuts or bends the tip ends of the probes for confirmation 12.

The set overdrive amount acquired by the inspection method described above is used for the measurement of the inspection object as a measurement target by the electrical connecting device 1. For example, the set overdrive amount is used as the specifications for the POD of the electrical connecting device 1.

The inspection method described above confirms the AOD at which the probes for measurement 11 are brought into contact with the inspection object with a predetermined pressure, so as to acquire the POD corresponding to the AOD. Confirming the AOD while regulating the POD can acquire the POD at which a predetermined pressure is ensured.

Various kinds of methods can be used for detecting the contact between the tip ends of the probes for confirmation 12 and the pads for inspection 210 in step S30 described above. For example, scars detected on the surfaces of the pads for inspection 210 caused by the contact with the tip ends of the probes for confirmation 12 can be used.

Figure 7:
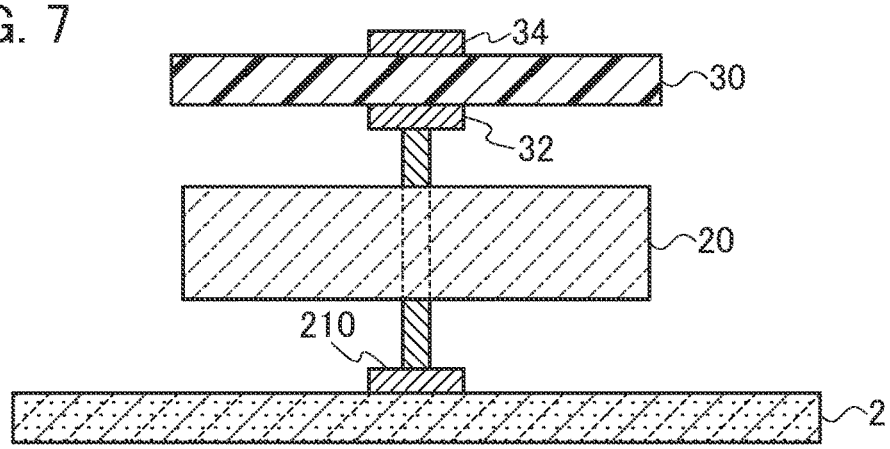
FIG. 7 is an electric circuit that detects an electrical connection between the probes for confirmation and a substrate for inspection.

Alternatively, the detection of the electrical connection between the probes for confirmation 12 and the substrate for inspection 2 can be used for the detection of the contact between the tip ends of the probes for confirmation 12 and the pads for inspection 210. For example, a measurement device electrically connected to the connection terminals for confirmation 34 can confirm the contact between the probes for confirmation 12 and the pads for inspection 210 when the lands for confirmation 32 are brought into contact with the pads for inspection 210 via the probes for confirmation 12, as illustrated in FIG. 7. The measurement device monitors a current I flowing between the lands for confirmation 32 and the pads for inspection 210 via the probes for confirmation 12, so as to confirm the contact between the probes for confirmation 12 and the pads for inspection 210.

To accurately detect the set overdrive amount, the probes for confirmation 12 are preferably used that are hard to deform by the contact with the pads for inspection 210. For example, the probes for confirmation 12 are used that have higher rigidity than the probes for measurement 11.

To facilitate the tip-end processing of the probes for confirmation 12 in step S50, the probes for confirmation 12 are preferably used that have a stepped structure in which the diameter at the part exposed from the probe head 20 is changed. The stepped structure is a structure in which the circumferential surface is recessed toward the middle, for example. The probes for confirmation 12 having the stepped structure can be easily cut off or bent at the part provided with the stepped structure.

Figure 8:
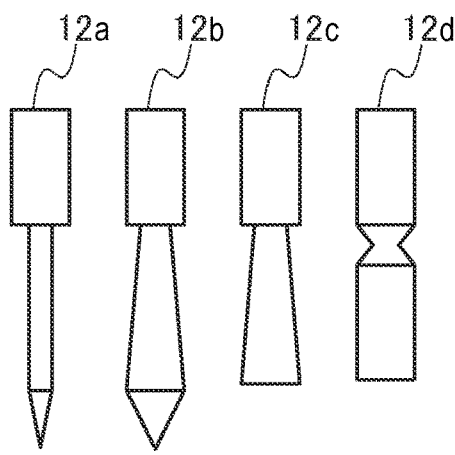
FIG. 8 depicts schematic diagrams showing examples of the probes for confirmation having stepped structures.

FIG. 8 shows examples of the probes for confirmation 12 with various stepped structures each having a smaller diameter. The stepped structure of the probes for confirmation 12a as illustrated in FIG. 8 has a straight shape having a constant diameter toward the tip end from the part at which the diameter is changed. The respective stepped structures of the probes for confirmation 12b and 12c as illustrated in FIG. 8 have a reversely-tapered shape having a diameter that is gradually increased from the part at which the diameter is changed toward the tip end. FIG. 8 illustrates the probe for confirmation 12b having a circular cone shape at the tip end, and FIG. 8 illustrates the probe for confirmation 12c having a flat shape at the tip end.

The stepped structure with the straight shape as illustrated for the probes for confirmation 12a in FIG. 8 facilitates the processing of the probes for confirmation 12a. The stepped structure with the reversely-tapered shape as illustrated for the probes for confirmation 12b, 12c in FIG. 8 facilitates the cutting or bending process at the part provided with the stepped structure. Alternatively, as illustrated for the probes for confirmation 12d in FIG. 8, a stepped structure in which the diameter of the probes for confirmation 12d is partly decreased may be used.

Any type of stepped structure that facilitates the cut-off or the bending of the tip ends of the probes for confirmation 12 may be used for the probes for confirmation 12. The stepped structure of any type still needs to have rigidity sufficient to prevent the probes for confirmation 12 from being broken off when the OD acts thereon.

When the probes for confirmation 12 are arranged on the outside of the probe area for measurement 21 as illustrated in FIG. 2, the tip-end processing of the probes for confirmation 12 avoids the contact between the tip ends of the probes for confirmation 12 and the inspection object. When the probes for confirmation 12 are arranged in the probe are for measurement 21 as illustrated in FIG. 3, the measurement of the inspection object by use of the electrical connecting device 1 is executed after the probes for confirmation 12 are replaced with the probes for measurement 11.

As described above, the electrical connecting device 1 can easily confirm the AOD corresponding to the set POD. The electrical connecting device 1 sets the POD at which the probes for measurement 11 are brought into contact with the inspection object with a predetermined pressure, so as to measure the inspection object with a high accuracy.

The inspection method by the electrical connecting device 1 can confirm the AOD only by preparing the probes for confirmation 12. This method thus can avoid an increase in the number of the measurement steps or the number of the components. The inspection method by the electrical connecting device 1 can directly confirm the AOD, so as to increase the reliability of the confirmation result of the AOD. In addition, the method of confirming the AOD can be simplified such that scars caused by the needles are detected.

The failure in the accurate confirmation of the relationship between the AOD and the POD may impede the contact of the probes for measurement 11 with the inspection object with an appropriate pressure. If bending or distortion is caused in the probe head 20 or the wiring substrate 30, for example, the distance between the probes for measurement 11 and the pads for measurement on the inspection object varies depending on the positions of the probes for measurement 11 when the electrical connecting device 1 is placed against the inspection object. This variation leads to the mixture of the areas having the smaller AOD and the larger AOD.

Setting the POD while confirming the AOD by the electrical connecting device 1 can avoid insufficiency of the pressure by the pads for measurement because of a larger distance between the probes for measurement 11 and the pads for measurement, or avoid excessiveness of the pressure by the pads for measurement because of a smaller distance between the probes for measurement 11 and the pads for measurement.

The electrical connecting device 1 can arbitrarily set the arrangement positions and the number of the probes for confirmation 12. For example, the probes for confirmation 12 are arranged at the positions at which the difference between the POD and the AOD is presumed to be large and at the positions at which the difference between the POD and the AOD is presumed to be small. Confirming the AOD as described above can avoid or decrease the insufficiency or excessiveness of the pressure. The increase in the arrangement positions and the number of the probes for confirmation 12 can acquire the information on in-plane distribution of the difference between the POD and the AOD with a high accuracy.

Modified Example

Figure 9:
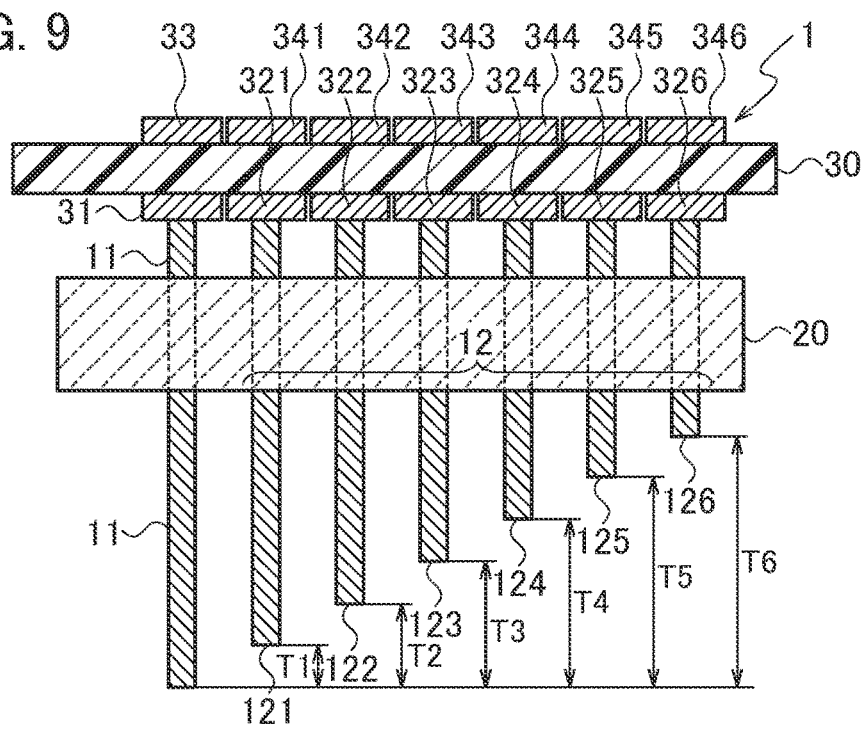
FIG. 9 is a schematic diagram showing a configuration of an electrical connecting device according to a modified example of the embodiment of the present invention.

To confirm the relationship between the POD and the AOD, plural probes for confirmation 12 having different tip-end lengths may be prepared, as illustrated in FIG. 9. FIG. 9 illustrates a case in which the probe head 20 holds first probes for confirmation 121 to sixth probes for confirmations 126 having different tip-end lengths. The base ends of the first probes for confirmation 121 to the sixth probes for confirmations 126 are in contact with lands for confirmation 321 to 326 of the wiring substrate 30. The lands for confirmation 321 to 326 are electrically connected to connection terminals for confirmation 341 to 346 arranged on the wiring substrate 30 in a wiring pattern provided on the wiring substrate 30.

With regard to the difference in the tip-end length from the probes for measurement 11, the difference T1 in the tip-end length of the first probes for confirmation 121 is set to 25 µm, the difference T2 in the tip-end length of the second probes for confirmation 122 is set to 50 µm, and the difference T3 in the tip-end length of the third probes for confirmation 123 is set to 75 µm. The difference T4 in the tip-end length of the fourth probes for confirmation 124 is set to 100 µm, the difference T5 in the tip-end length of the fifth probes for confirmation 125 is set to 125 µm, and the difference T6 in the tip-end length of the sixth probes for confirmation 126 is set to 150 µm.

The first probes for confirmation 121 to the sixth probes for confirmations 126 are brought into contact with the substrate for inspection 2 in this order when the gap between the electrical connecting device 1 illustrated in FIG. 9 and the substrate for inspection 2 is gradually decreased. Storing the POD at the timing of detecting the contact between the substrate for inspection 2 and each of the first probes for confirmation 121 to the sixth probes for confirmations 126 can confirm the relationship between the POD and the AOD.

The POD thus can be chosen at which the preferred AOD is acquired in accordance with the relationship between the POD and the AOD obtained as described above. The measurement with the chosen POD enables the contact between the probes for measurement 11 and the inspection object with a predetermined pressure.

Other Embodiments

While the present invention has been described above by reference to the embodiment and example, it should be understood that the present invention is not intended to be limited to the descriptions and the drawings composing part of this disclosure. Various alternative embodiments, examples, and technical applications will be apparent to those skilled in the art according to this disclosure. It should also be understood that the present invention includes various embodiments not disclosed herein. Therefore, the technical scope of the present invention is defined only by the subject matter according to the claims reasonably derived from the foregoing illustrative descriptions.

What is claimed is:

1. An electrical connecting device comprising:
a probe head;
a probe for measurement held by the probe head in a state in which a tip end is exposed from the probe head and used for a measurement of an inspection object; and
a probe for confirmation held by the probe head in a state in which a tip end is exposed from the probe head and having a shorter tip-end length than the probe for measurement, the tip-end length being an exposed length from the probe head to the tip end;
wherein the probe for measurement is brought into contact with the inspection object in a confirmation state in which the tip end of the probe for confirmation is also brought into contact with the inspection object, and an overdrive amount acting on the probe for measurement in the confirmation state is stored, the stored overdrive amount corresponding to a predetermined pressure or force to be applied to the probe for measurement during the measurement of the inspection object;
wherein the tip end of the probe for measurement contacts the inspection object during the measurement of the inspection object; and
wherein the probe for confirmation has a stepped structure in which a diameter changes at a part exposed from the probe head and a circumferential surface is recessed toward a middle, and the probe for confirmation is cut off or bent at a part provided with the stepped structure so that the tip end of the probe for confirmation does not contact the inspection object during the measurement of the inspection object.

2. The electrical connecting device according to claim 1, wherein a difference in the tip-end length between the probe for measurement and the probe for confirmation is set depending on a pressure at which the probe for measurement is brought into contact with the inspection object.

3. The electrical connecting device according to claim 1, further comprising a plurality of probes for confirmation having different tip-end lengths.

4. The electrical connecting device according to claim 1, wherein the probe head holds the probe for confirmation on an outside of a region in which the probe head holds the probe for measurement in a plan view.

5. The electrical connecting device according to claim 1, wherein the probe for measurement and the probe for confirmation are present and mixed together in a region in which the probe head holds the probe for measurement.

6. An inspection method comprising:
preparing a probe head configured to hold a probe for measurement and a probe for confirmation in a state in which tip ends of the probe for measurement and the probe for confirmation are exposed therefrom, the probe for confirmation having a shorter tip-end length which is an exposed length from the probe head to the tip end than the probe for measurement;
decreasing a gap between the probe head and an object for inspection to bring the probe for measurement into contact with the object for inspection in a confirmation state in which the tip end of the probe for confirmation is also brought into contact with the object for inspection;
storing an overdrive amount acting on the probe for measurement in the confirmation state, the stored overdrive amount corresponding to a predetermined pressure or force to be applied to the probe for measurement during a measurement of the object for inspection;
wherein the tip end of the probe for measurement contacts the object for inspection during the measurement of the object for inspection; and
wherein the probe for confirmation has a stepped structure in which a diameter changes at a part exposed from the probe head and a circumferential surface is recessed toward a middle, and the probe for confirmation is cut off or bent at a part provided with the stepped structure so that the tip end of the probe for confirmation does not contact the object for inspection during the measurement of the object for inspection.

7. The inspection method according to claim 6, wherein a difference in the tip-end length between the probe for measurement and the probe for confirmation is set depending on a pressure at which the probe for measurement is brought into contact with the inspection object.

8. The inspection method according to claim 6, wherein an electrical connection between the probe for confirmation and the substrate for inspection is detected so as to detect the contact between the probe for confirmation and the substrate for inspection.

9. The inspection method according to claim 6, further comprising executing a tip-end processing of shortening the tip-end length of the probe for confirmation after bringing the probe for confirmation into contact with the substrate for inspection.

* * * * *